(12) United States Patent
Fukakusa et al.

(10) Patent No.: US 11,331,901 B2
(45) Date of Patent: May 17, 2022

(54) PRINTING APPARATUS

(71) Applicant: FUJI CORPORATION, Chiryu (JP)

(72) Inventors: Shoji Fukakusa, Yokkaichi (JP);
Ritsuo Hirukawa, Nishio (JP);
Yoshimune Yokoi, Kiyosu (JP); Naoki Matsuzaki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 329 days.

(21) Appl. No.: 16/465,219

(22) PCT Filed: Dec. 5, 2016

(86) PCT No.: PCT/JP2016/086103
§ 371 (c)(1),
(2) Date: May 30, 2019

(87) PCT Pub. No.: WO2018/105017
PCT Pub. Date: Jun. 14, 2018

(65) Prior Publication Data
US 2020/0001593 A1    Jan. 2, 2020

(51) Int. Cl.
*B41F 15/44* (2006.01)
*B41F 15/08* (2006.01)
*B41F 15/42* (2006.01)
*H05K 3/34* (2006.01)

(52) U.S. Cl.
CPC .......... *B41F 15/44* (2013.01); *B41F 15/0881* (2013.01); *B41F 15/423* (2013.01); *H05K 3/3485* (2020.08)

(58) Field of Classification Search
CPC .... B41F 15/44; B41F 15/423; B41F 15/0881; H05K 3/3485
See application file for complete search history.

(56) References Cited

U.S. PATENT DOCUMENTS

| | | | | |
|---|---|---|---|---|
| 4,122,771 | A | * 10/1978 | Barton | B41F 15/44 101/123 |
| 4,638,733 | A | * 1/1987 | Schneider | B41F 15/44 101/114 |
| 4,841,854 | A | * 6/1989 | Bubley | B41F 15/44 101/123 |

(Continued)

FOREIGN PATENT DOCUMENTS

| JP | 4-107146 A | 4/1992 |
|---|---|---|
| JP | 6-320709 A | 11/1994 |

(Continued)

OTHER PUBLICATIONS

International Search Report dated Feb. 14, 2017 in PCT/JP2016/086103 filed on Dec. 5, 2016.

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

A printing apparatus including: a squeegee fixing section configured to switch to and from a fixed state in which a squeegee used to print a viscous fluid onto a print target is fixed and a released state in which the squeegee is not fixed; and a squeegee moving section configured to move the squeegee fixed by the squeegee fixing section above a screen mask during printing by moving the squeegee fixing section.

12 Claims, 8 Drawing Sheets

(56) References Cited

U.S. PATENT DOCUMENTS

| | | | | |
|---|---|---|---|---|
| 4,995,316 | A | * | 2/1991 | Kolblin ............... B41F 15/0818 |
| | | | | 101/114 |
| 5,361,694 | A | * | 11/1994 | Dubuit ................ B41F 15/0804 |
| | | | | 101/115 |
| 5,458,060 | A | | 10/1995 | Casl |
| 5,722,321 | A | | 3/1998 | Szyszko et al. |
| 6,237,490 | B1 | * | 5/2001 | Takahashi ............ H05K 3/1233 |
| | | | | 101/129 |
| 2004/0025721 | A1 | * | 2/2004 | Pingel .................... B41F 15/44 |
| | | | | 101/123 |
| 2006/0266234 | A1 | * | 11/2006 | Weber .................... B41F 15/44 |
| | | | | 101/123 |
| 2014/0047989 | A1 | | 2/2014 | Hoffman, Jr. et al. |
| 2018/0065357 | A1 | * | 3/2018 | Mantani ............. B41F 15/0881 |

FOREIGN PATENT DOCUMENTS

| | | | | |
|---|---|---|---|---|
| JP | 07186362 | * | 7/1995 | ............. B41F 15/08 |
| JP | 2002-172758 A | | 6/2002 | |
| JP | 2003-154626 A | | 5/2003 | |
| JP | 2006-305822 A | | 11/2006 | |
| JP | WO2014/013592 A1 | | 1/2014 | |
| JP | WO2014/091546 A1 | | 6/2014 | |
| WO | 2012154161 | * | 11/2012 | .......... A47L 11/4044 |

\* cited by examiner

PRINTING APPARATUS

TECHNICAL FIELD

The present application relates to a printing apparatus.

BACKGROUND ART

Conventionally, in a printing apparatus that performs printing of a viscous fluid using a screen mask onto a print target such as a board, there is an apparatus that performs automatic exchange of the screen mask. For example, disclosed in patent literature 1 is a printing apparatus provided with a rod that protrudes downwards, and a sliding member that, by sliding the rod, slides the screen mask and pushes it to a main body frame.

CITATION LIST

Patent Literature

Patent literature 1: JP-A-H04-107146

BRIEF SUMMARY

Technical Problem

With a printing apparatus, it is also necessary to exchange a squeegee that prints viscous fluid onto a print target. However, with a printing apparatus of patent literature 1, nothing is disclosed regarding squeegee exchange. Conventionally, exchange of a squeegee is performed manually by an operator removing attachment screws or the like that attach the squeegee. With such a printing apparatus, it is desirable to reduce the work of an operator.

The present disclosure solves the above problems, and an object thereof is to reduce the work of an operator related to squeegee exchange.

Solution to Problem

The present disclosure employs the following means to achieve the above object.

A printing apparatus of the present disclosure includes: a squeegee fixing section configured to switch to and from a fixed state in which a squeegee used to print a viscous fluid onto a print target is fixed and a released state in which the squeegee is not fixed; and a squeegee moving section configured to move the squeegee fixed by the squeegee fixing section above a screen mask during printing by moving the squeegee fixing section.

With the printing apparatus, printing is performed by moving the squeegee by a squeegee moving section moving a squeegee fixing section that is in a fixed state. When the squeegee is exchanged, because the squeegee fixing section is switched to and from a fixed state and a released state, for example, as described above, it is not necessary for an operator to perform work such as removing screws. Accordingly, the printing apparatus is able to reduce the work of an operator related to squeegee exchange.

DESCRIPTION OF EMBODIMENTS

Figure 1:
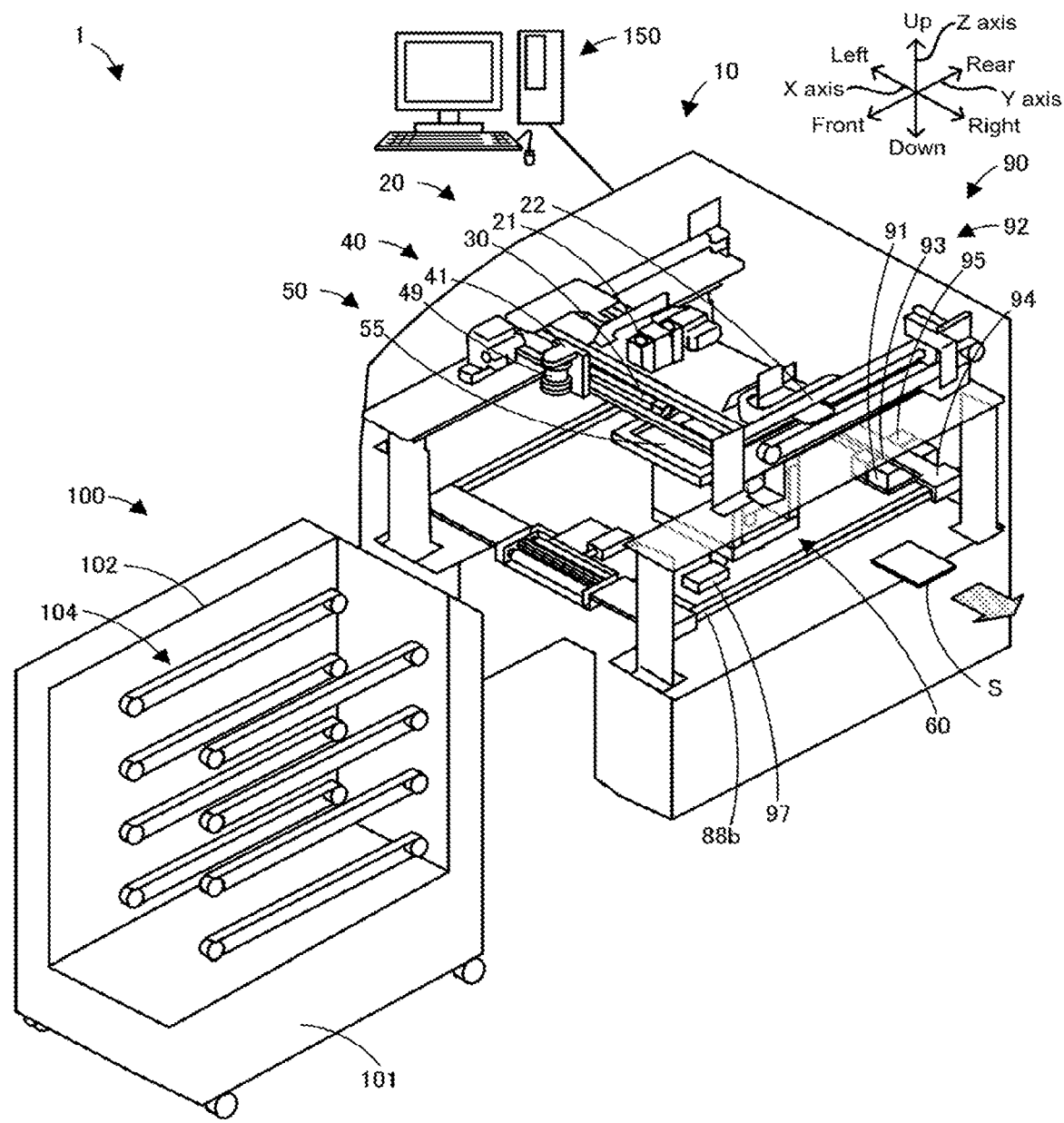
FIG. 1 shows an example of the overall configuration of printing system 1.
Figure 2:
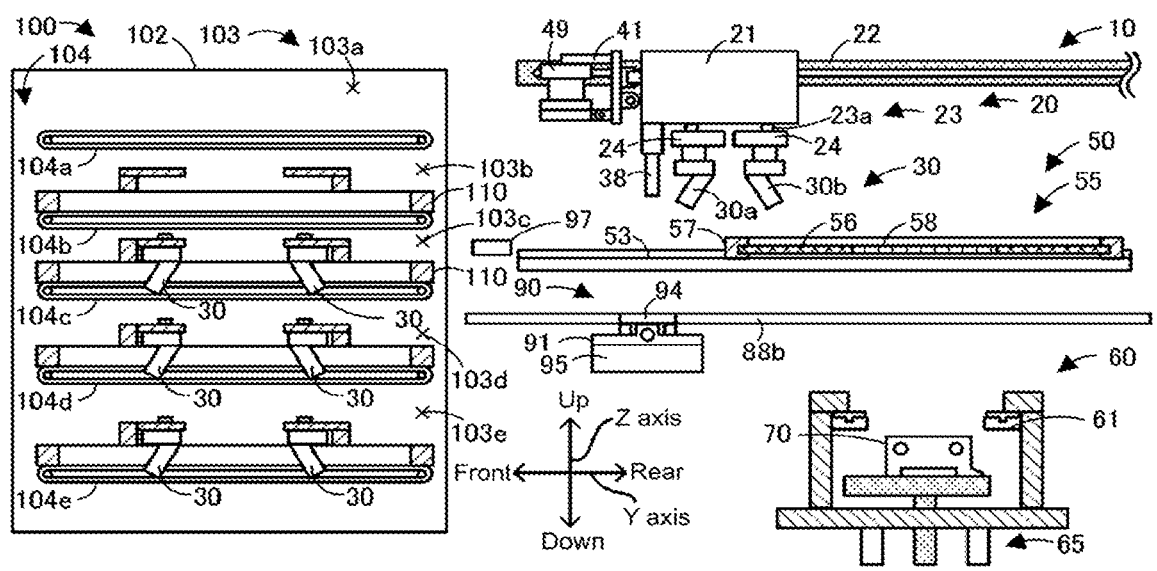
FIG. 2 is a cross section of printing apparatus 10 and accommodation apparatus 100.
Figure 3:
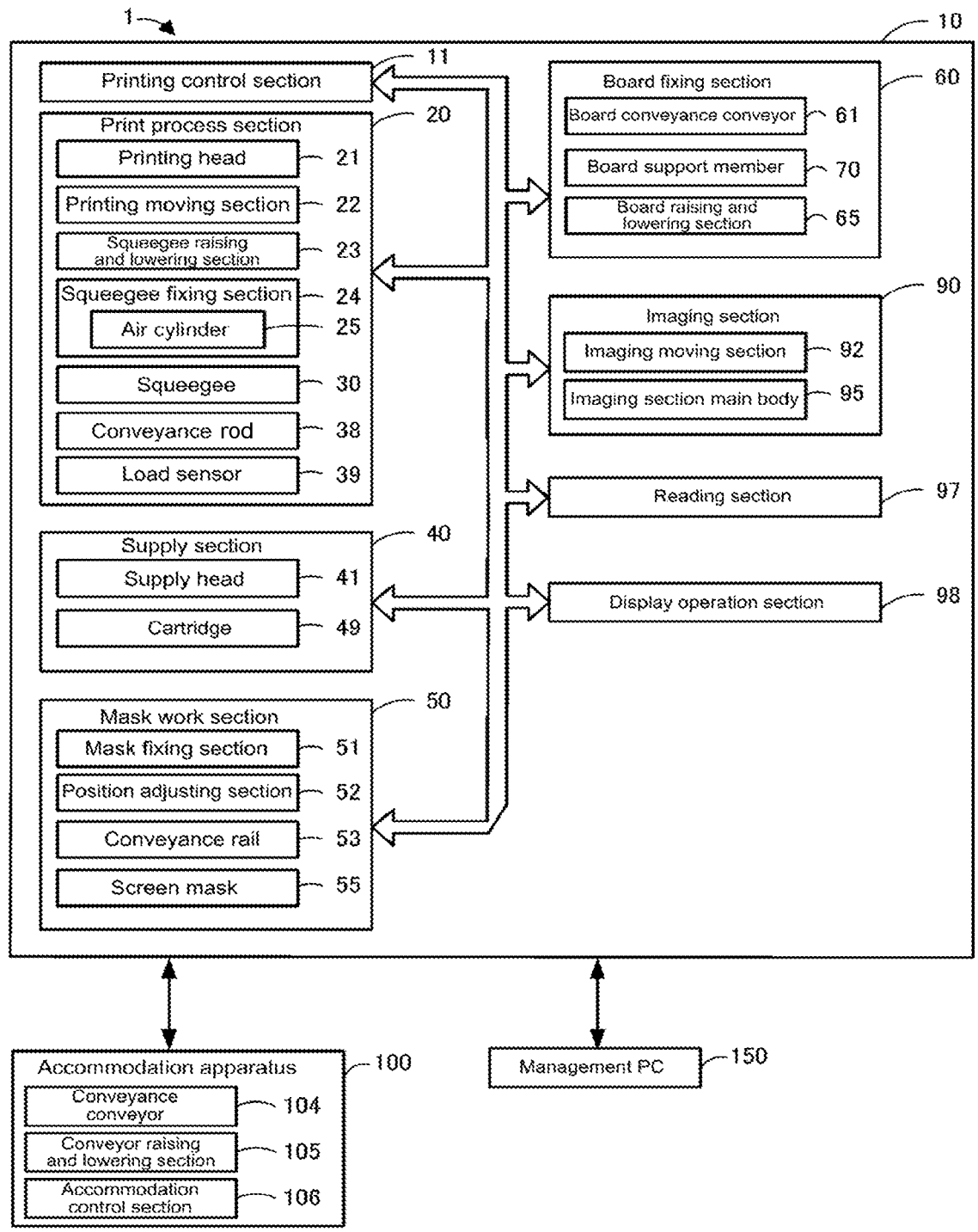
FIG. 3 is a block diagram showing electrical connections of printing system 1.
Figure 4:
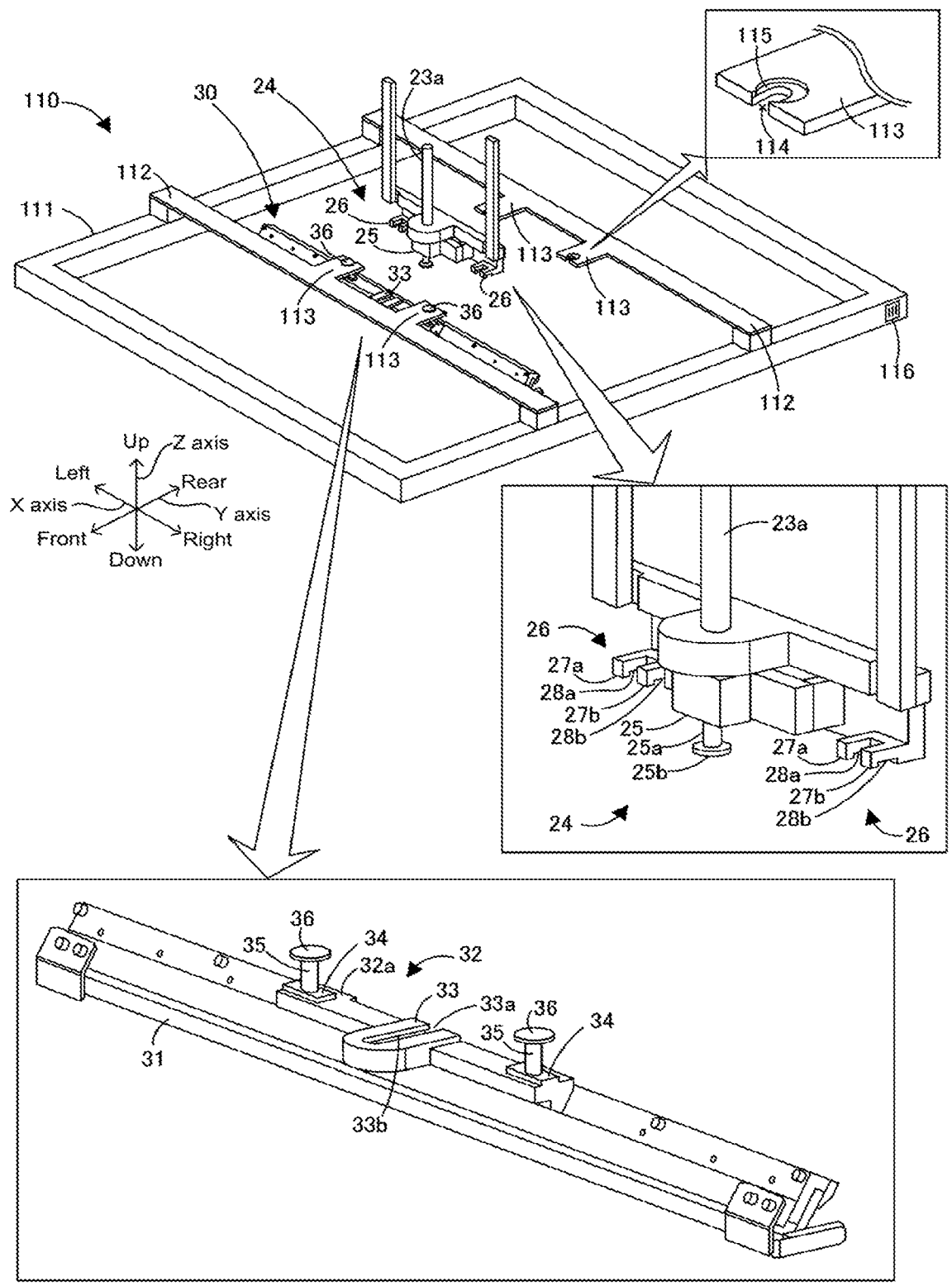
FIG. 4 is a perspective view of squeegee fixing section 24, squeegee 30, and squeegee conveyance jig 110.

Embodiments of the present disclosure are described below with reference to the figures. FIG. 1 shows an example of the overall configuration of printing system 1 as an embodiment of the present disclosure. FIG. 2 is a cross section of printing apparatus 10 and accommodation apparatus 100. FIG. 3 is a block diagram showing electrical connections of printing system 1. FIG. 4 is a perspective view of squeegee fixing section 24, squeegee 30, and squeegee conveyance jig 110. Printing system 1 is provided with printing apparatus 10 that performs printing of solder paste (also referred to as simply solder) as a viscous fluid onto a print target (here, board S) using screen mask 55. Printing system 1 is also provided with accommodation apparatus 100 that accommodates exchange-use squeegee 30 used in printing apparatus 10, and management computer (PC) 150 that performs management of information related to processing of printing apparatus 10. Note that, printing system 1 may be configured as a mounting system also provided with other board work devices such as component mounters, not shown, that mounting electronic components on board S. Besides solder, other examples of a viscous fluid include conductive paste and adhesive. Printing apparatus 10 is configured as an apparatus capable of automatically exchanging squeegee 30 used in printing. Also, exchange processing of squeegee 30 is performed using squeegee conveyance jig 110 shown in FIGS. 2 and 4. In the present embodiment, left-right directions (X axis), front-rear directions (Y axis), and up-down directions (Z axis) are set as shown in FIGS. 1 and 2.

Printing apparatus 10, as shown in FIGS. 1 and 2, performs application (printing) of solder onto board S through hole pattern 58 formed in screen mask 55 by using squeegee 30 to squeeze solder loaded on screen mask 55 through the hole pattern 58. Printing apparatus 10 is provided with printing control section 11 (an example of an exchange control section, shown in FIG. 3), print process section 20, supply section 40, mask work section 50, board fixing section 60, cleaning section 80, and reading section 97. Also, printing apparatus 10 is provided with display operation section 98 (FIG. 3) configured as an operation panel that displays items on a display screen and receives various inputs from an operator, and a communication section, not shown, that performs communication with other connected devices.

Printing control section 11 is configured from a microprocessor based around a CPU, and is provided with ROM that memorizes a processing program, RAM used as working memory, an HDD that memorizes various data, and so on. Printing control section 11 performs overall control of printing apparatus 10.

Print process section 20 is provided on an upper level of printing apparatus 10 and is a unit for performing a process of printing a viscous fluid on board S using screen mask 55. As shown in FIG. 3, print process section 20 is provided with printing head 21, printing moving section 22, squeegee raising and lowering section 23, squeegee fixing section 24, squeegee 30, conveyance rod 38, and load sensor 39. Printing moving section 22 is for moving printing head 21 in a specified direction (here, a front-rear direction) and is provided with a guide formed in the front-rear direction, a slider that moves along the guide, and a motor that drives the slider. Squeegee raising and lowering section 23 is configured as an air cylinder including piston rod 23a (FIGS. 2 and 4), and raises and lowers squeegee fixing section 24 and squeegee 30 by raising and lowering piston rod 23a. Print process section 20 includes two squeegees 30, first and second squeegees 30a and 30b, and correspondingly includes two piston rods 23a and two squeegee fixing sections 24. Load sensor 39 is arranged on each of two piston rods 23a, and is configured from, for example, a load cell. Load sensor 39 detects a load that first and second squeegees 30a and 30b apply to screen mask 55 during printing.

The two squeegee fixing sections 24 are configured the same except for being arranged oppositely at the front and rear, thus, descriptions are only given for the front squeegee fixing section using FIG. 4. FIG. 4 shows a state before squeegee 30 is attached to squeegee fixing section 24, and in FIG. 4 squeegee 30 is attached to squeegee conveyance jig 110 used for squeegee exchange processing, which is described later.

Squeegee fixing section 24 is configured to perform switching of a squeegee 30 (here, first squeegee 30a) to and from a fixed state in which squeegee 30 is fixed and a released state in which squeegee 30 is not fixed. As shown in FIG. 4, squeegee fixing section 24 is connected to a lower end of piston rod 23a, and is provided with air cylinder 25 and regulating member 26. Air cylinder 25 is a mechanism for raising and lowering cylinder shaft 25a that protrudes downwards. Flange 25b is formed at a lower end of cylinder shaft 25a, and the upper surface of flange 25b is formed to support squeegee 30 from below. Regulating member 26 engages with protruding section 34 of squeegee 30 in a fixed state to regulate front-rear movement of squeegee 30. One regulating member 26 is provided on the left and right sides of air cylinder 25. Each regulating member 26 includes claw sections 27a and 27b that protrude to the front. Recesses 28a and 28b that face up are formed on the lower surfaces of claw sections 27a and 27b. With squeegee fixing section 24, a state in which air cylinder 25 has raised flange 25b is a fixed state, and a state in which air cylinder has lowered flange 25b relative to the fixed state is a released state. By this raising and lowering of flange 25b, squeegee fixing section 24 sandwiches attachment member 32 of squeegee 30 between the lower surface of regulating member 26 and the upper surface of flange 25b in the fixed state. Further, in a released state, squeegee fixing section 24 releases the fixing of squeegee 30 by relatively moving flange 25b and regulating member 26 in a vertical direction compared to the fixed state.

As shown in FIG. 4, squeegee 30 is provided with squeegee blade 31 formed longer to the left and right than hole pattern 58 (FIG. 2), and attachment member 32 for attaching squeegee blade 31 to squeegee fixing section 24. Attachment member 32 is provided with positioning member 33, protruding section 34, shaft member 35, and flange section 36. Positioning member 33 is formed in a U-shape as seen from above, and includes opening section 33a through which cylinder shaft 25a of squeegee fixing section 24 can pass through, and held surface 33b that protrudes horizontally towards opening section 33a that is a lower surface of positioning member 33 (towards the inside of the U shape). When cylinder shaft 25a of squeegee fixing section 24 is inserted inside opening section 33a of positioning member 33 towards the front, the upper surface of flange 25b faces held surface 33b in the vertical direction. This held surface 33b and held surface 32a that is the upper surface of attachment member 32 are configured such that squeegee 30 is fixedly held in squeegee fixing section 24 by being sandwiched between the upper surface of cylinder shaft 25a of squeegee fixing section 24 and the lower surface of regulating member 26. One protruding section 34 each is provided on the left and right side positioning members 33, and the protruding sections 34 are configured to engage with regulating member 26 by being inserted into recesses 28a and 28b of squeegee fixing section 24. By the engagement of regulating member 26 and protruding section 34, the movement of squeegee 30 in the front-rear direction with respect to squeegee fixing section 24 is regulated. One shaft member 35 each is provided for the left and right positioning members 33, and each shaft member 35 protrudes up from the upper surface of protruding section 34. Flange sections 36 are respectively formed on the upper ends of shaft members 35. Flange section 36 is for engaging with engaging section 115 of squeegee conveyance jig 110.

FIG. 4 also shows squeegee conveyance jig 110 used in automatic exchange of squeegee 30 by printing apparatus 10. Squeegee conveyance jig 110 is provided with frame 111, holder 112 to which squeegee 30 can be attached, and barcode 116 provided near the rear end at the right side of frame 111. Squeegee conveyance jig 110 is provided with two holders 112 that are symmetrical in a front-rear direction. Each holder 112 is provided with a main body portion arranged straddling frame 111 in a left-right direction, and support section 113 protruding to the inside from the main body portion in the front-rear direction of frame 111. Two support sections 113 are provided in parallel on the left and right for each holder 112. As shown in the enlarged box in the top right of FIG. 4, support section 113 includes opening section 114 through which shaft member 35 of squeegee 30 can pass through in the front-rear direction. Also, support section 113 includes engaging section 115 that engages with flange section 36 of squeegee 30 to fix squeegee 30. Engaging member 115 is a recess formed in the edge of the opening of support section 113 into which a portion of the lower surface of flange section 36 fits. When flange section 36 is fitted into engaging section 115, relative movement of squeegee 30 in the XY direction with respect to squeegee conveyance jig 110 is regulated by the weight of squeegee 30 itself. Also, squeegee 30, at a position raised up such that flange section 36 is separated from engaging section 115 (referred to as a removal position), is released from the regulating of movement in the XY direction, and is able to be removed from opening section 114. Barcode 116 is identification information for identifying the squeegee 30 attached to squeegee conveyance jig 110, and is read in advance by an operator, for example.

Conveyance rod 38 is provided in printing head 21 (FIG. 2) in a manner capable of being raised and lowered by a motor, which is not shown. Conveyance rod 38, by being moved to the front or rear by printing moving section 22 in a state protruding below squeegee 30, pushes and conveys screen mask 55 and each conveyance jig loaded on conveyance rails 53. By this, conveyance rod 38 is able to load and unload screen mask 55 and each conveyance jig from accommodation apparatus 100 to printing apparatus 10.

Supply section 40 is provided with supply head 41 and cartridge 49 in which solder is housed. Supply head 41 supplies pressure to cartridge 49 by, for example, air, such that solder is ejected from a nozzle, not shown, on the lower surface of cartridge 49. Supply section 40 is attached to printing head 21 and is moved to the front and rear by printing moving section 22.

Mask work section 50 is a unit for fixing and holding screen mask 55 and is provided between print process section 20 and board fixing section 60 in a vertical direction as shown in FIG. 2. As shown in FIG. 3, mask work section 50 is provided with mask fixing section 51, position adjusting section 52, and conveyance rail 53. Mask fixing section 51 is for positioning screen mask 55 and holding and fixing it in a horizontal posture. Position adjusting section 52 is for adjusting the position of mask fixing section 51 in the XY direction such that hole pattern 58 of screen mask 55 is arranged at a correct position with respect to the board S fixed by board fixing section 60. Conveyance rail 53 is a pair of left and right rails extending in the front-rear direction, and acts to guide screen mask 55 and each conveyance jig pushed by conveyance rod 38 as they move in the front-rear direction. Screen mask 55 is provided with mask main body 56 in which hole pattern 58 of a specified wiring pattern or the like is formed, and frame 57 that supports mask main body 56 at a specified tension, mask main body 56 being, for example, a thin metal plate. An identification section (for example, a mark) for position identification is formed on the lower surface of screen mask 55. A barcode, not shown, representing identification information of screen mask 55 is provided near the rear end on the right side of screen mask 55. The barcode, for example, is read in advance by an operator.

As shown in FIGS. 2 and 3, board fixing section 60 is provided below mask work section 50, and is a unit for loading board S, positioning and supporting the loaded board S, and moving the board S towards and away from screen mask 55. Board fixing section 60 is provided with board conveyance conveyor 61 that conveys boards S in the left-right, board support member 70 that supports board S from below, and board raising and lowering section 65 that raises and lowers board fixing section 60 overall and board support member 70.

Imaging section 90, as shown in FIG. 2, is arranged between board fixing section 60 and mask work section 50 in the vertical direction, and is a unit that performs imaging processing of capturing images. As shown in FIGS. 1 and 2, imaging section 90 is provided with carriage 91, imaging moving section 92, and imaging section main body 95. Carriage 91 is arranged with imaging section main body 95 and is moved in the XY direction by imaging moving section 92. Imaging moving section 92 is provided with X-axis slider 93 and Y-axis slider 94. Y-axis slider 94 is a plate member with the lengthwise direction in the X-axis direction, and is moved along pair of guide rails 88 using a movement motor. X-axis slider 93 is arranged on carriage 91, and is moved by a movement motor along guides provided in the X-axis direction on the lower side of Y-axis slider 94. Imaging section main body 95 has an imaging region in an upper direction and a down direction, and is provided with a lighting section, an optical unit, and an imaging element. Imaging section main body 95 is able to image, for example, an identification section formed on the lower surface of screen mask 55 and identification section 75 of board support member 70. Further, imaging section main body 95 is capable of imaging the top surface of board S fixed by board fixing section 60, and acquires a captured image as printing result information related to the printing results of printing onto board S.

Reading section 97 is for reading information related to exchange-use squeegee 30 accommodated in accommodation apparatus 100 and in the present embodiment is configured from a barcode reader. As shown in FIG. 1, reading section 97 is provided on the right side inside printing apparatus 10, and the left direction is the reading direction. Reading section 97 is arranged at a height the same as the height at which screen mask 55 is loaded and unloaded (loading height), such that a barcode provided near the front end on the right side of screen mask 55 can be read. Also, reading section 97 is able to read barcode 116 so long as squeegee conveyance jig 110 is conveyed at the same height.

Accommodation apparatus 100 is arranged at the front of printing apparatus 10, and accommodates exchange-use squeegee 30, and performs loading and unloading of squeegee 30 to and from printing apparatus 10. Accommodation apparatus 100 is provided with housing 101, accommodation section 102, conveyance conveyor 104, conveyor raising and lowering section 105, and accommodation control section 106. Housing 101 is roughly a cuboid box and includes accommodation section 102 on the inside. Moving sections such as casters are provided on the lower surface of housing 101 such that, for example, accommodation apparatus 100 can be moved by an operator. Accommodation section 102 is a box capable of accommodating exchange-use squeegee 30 and squeegee conveyance jig 110, and is provided with multiple conveyance conveyors 104 inside thereof. Accommodation section 102 can also accommodate screen mask 55. Conveyance conveyors 104 are provided at multiple levels in the vertical direction, and in the present embodiment, as shown in FIG. 2, there are five conveyance conveyors 104a to 104e arranged in order from a first to a fifth. Each of the first to fifth conveyance conveyors 104a to 104e is configured with a pair of left and right belt conveyors, so as to convey a loaded item in the front-rear direction. Note that, for ease of understanding, only four levels of conveyance conveyors 104 are shown. Accommodation section 102 is configured to be able to load at least one squeegee 30 in each of the first to fifth conveyance conveyors 104a to 104e. Accommodation section 102 includes multiple levels of accommodation regions 103 in the vertical direction divided according to first to fifth conveyance conveyors 104a to 104e. Accommodation region 103 includes first accommodation region 103a as a region above first conveyance conveyor 104a, and similarly includes second to fifth accommodation regions 103b to 103e respectively above second to fifth conveyance conveyors 104b to 104e. Accommodation section 102 is open at the front and rear. Thus, an operator is able to insert squeegee 30 into accommodation section 102 from the front, and accommodation apparatus 100 is able to load and unload squeegees 30 to and from printing apparatus 10 via the rear of accommodation section 102. Conveyor raising and lowering section 105 is configured to raise and lower accommodation section in a vertical direction and is provided with, for example, a guide, a ball screw, and a driving motor, which are not shown. By conveyor raising and lowering section 105 raising or lowering accommodation section 102, conveyance conveyor 104 is raised or lowered. Note that, conveyance jig 110 and screen mask 55 have a predetermined width in the left-right direction that enables them to be loaded on the multiple conveyance conveyors 104, for example, they may all have substantially the same width in the left-right direction.

Accommodation control section 106 is configured from a microprocessor based around a CPU, and is provided with ROM that memorizes a processing program, RAM used as working memory, an HDD that memorizes various data, and so on. Accommodation control section 106 performs overall control of accommodation apparatus 100.

Figure 5:
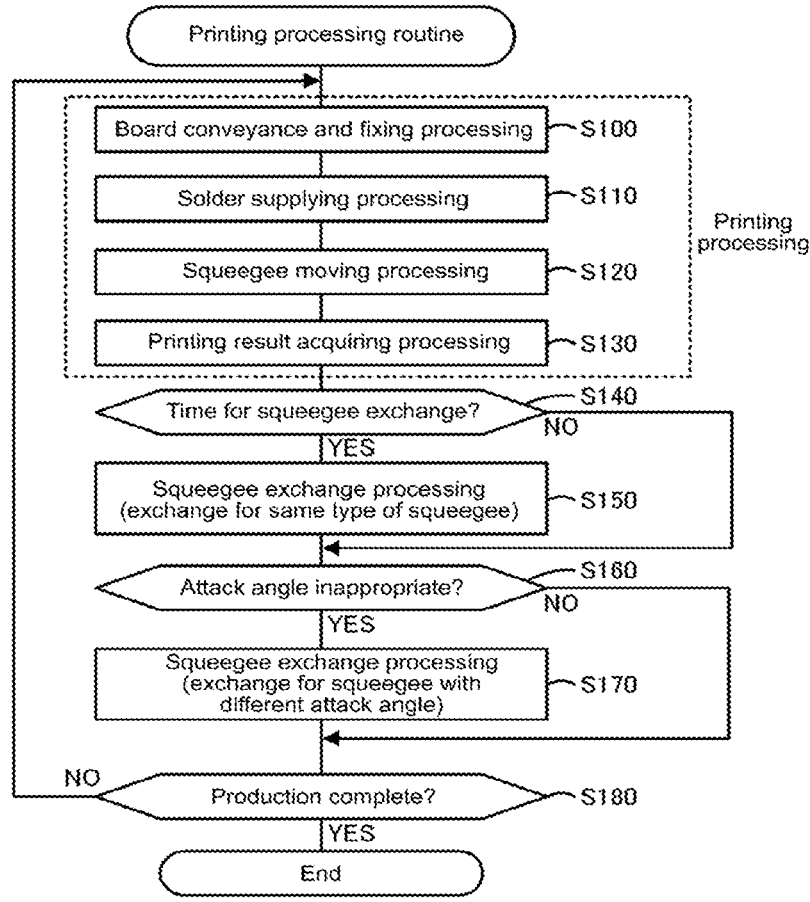
FIG. 5 is a flowchart showing an example of a printing processing routine.
Figure 6:
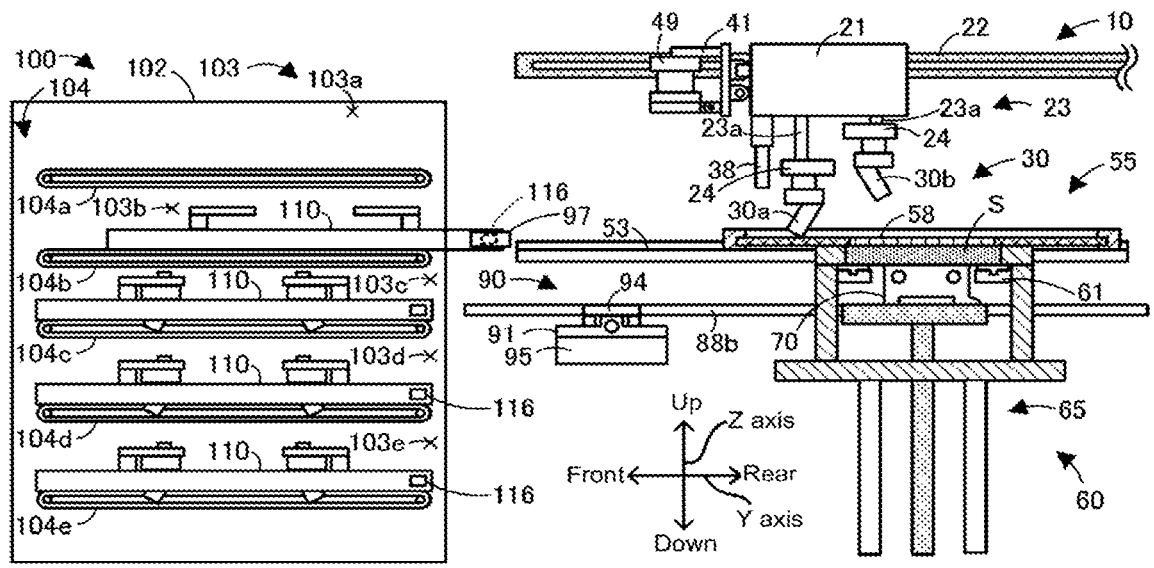
FIG. 6 illustrates a printing process and a reading process being performed in parallel.

Operation of the above printing system 1 is described next. In particular, descriptions are given with regard to printing processing performed by printing apparatus 10 while performing automatic exchange of squeegee 30 as required, and reading processing for reading identification information of squeegees 30 accommodated in accommodation apparatus 100 that is performed in parallel with printing processing. FIG. 5 illustrates an example of a printing process routine. FIG. 6 illustrates a printing process and a reading process being performed in parallel.

First, descriptions are given of work performed by an operator with respect to accommodation apparatus 100. While printing apparatus 10 is performing printing processing of steps S100 to S130 shown in FIG. 5, which are described later, in a case in which it is necessary to exchange squeegee 30, a squeegee conveyance jig 100 to which is attached an exchange-use squeegee 30 may be accommodated in advance in accommodation apparatus 100. Also, an operator accommodates in accommodation apparatus 100 at least one empty squeegee conveyance jig 110 required for unloading from printing apparatus 10 the squeegee 30 currently in use. Further, an operator leaves at least one of the multiple accommodation regions 103 empty for use for unloading from printing apparatus 10 of the screen mask 55 currently in use. In FIG. 2, first accommodation region 103a is empty, and empty squeegee conveyance jig 110 is accommodated in second accommodation region 103b. Further, squeegee conveyance jig 110 to which is attached squeegee 30 the same type as the squeegee 30 currently in use (for example, with the same attack angle) is accommodated in third accommodation region 103c. Further, squeegee conveyance jigs 110 to which are attached two types of squeegees 30 with a different attack angle to the squeegee 30 currently in use are accommodated in fourth and fifth accommodation regions 103d and 103e. An operator, while printing apparatus 10 is performing printing processing and it is not time to exchange a squeegee 30, may load in advance an exchange-use squeegee 30 to accommodation apparatus 100. Accordingly, the operator is able to perform work for exchange-use squeegees 30 during a period in which their workload is light.

Note that, the operator may attach in advance to each squeegee conveyance jig 110 a barcode indicating the identification information of the squeegee 30 attached to that squeegee conveyance jig 110. Note that, the operator may include information representing the type (here, the attack angle) of the squeegee 30 attached to the squeegee conveyance jig 110 in the barcode 116 affixed to that squeegee conveyance jig 110. Note that, information representing a state of the squeegee conveyance jig 110 may also be included in the barcode 116. For example, barcode 116 may include information representing whether each of the two holders 112 of the squeegee conveyance jig 110 is empty. Thus, printing control section 11, by using reading section 97 to read barcode 116 of squeegee conveyance jig 110, is able to identify whether a holder 112 of squeegee conveyance jig 110 is empty and identify the type of squeegee 30 attached to the squeegee conveyance jig 110.

Reading processing is described next. The reading processing routine for performing reading processing is memorized on the HDD of printing control section 11, and is performed, for example, at a specified time interval, or after an instruction to perform reading processing is entered by an operator. When the reading processing routine is started, printing control section 11 outputs an instruction to accommodation control section 106 of accommodation apparatus 100 to sequentially move squeegee conveyance jig 110 accommodated in accommodation section 102 to a position at which reading is possible by reading section 97. Accommodation control section 106 that has received this instruction, first, performs raising or lowering of conveyor raising and lowering section 105 as required such that the height of reading section 97 and the height of the squeegee conveyance jig 110 loaded on conveyance conveyor 104 are the same. Next, accommodation control section 106 uses conveyance conveyor 104 to move the squeegee conveyance jig 110 to the rear to move barcode 116 to a position at which reading is possible by reading section 97. Then, accommodation control section 106 moves the squeegee conveyance jig 110 to return it to its original position. Here, printing control section 11 uses reading section 97 to read barcode 116 and memorizes the acquired information on the HDD. Accommodation control section 106 performs similar processing sequentially for first conveyance conveyor 104a to fifth conveyance conveyor 104e. FIG. 6 shows accommodation apparatus 100 in a state with squeegee conveyance jig 110 accommodated in second accommodation region 103b moved to a position at which reading by reading section 97 is possible. According to such reading processing, printing control section 11 acquires and memorizes information required for squeegee exchange processing, which is described later, such as information of the types of squeegee 30 accommodated in each of the accommodation regions 103 of accommodation apparatus 100, and information of in which of the multiple accommodation regions 103 empty squeegee conveyance jigs 110 are accommodated. Also, printing control section 11 is able to identify empty accommodation regions 103 that do not accommodate a squeegee conveyance jig 110 (in FIG. 6, this is first accommodation region 103a) by, for example, detecting that a specified time has elapsed without reading section 97 having read information despite conveyance having been performed by conveyance conveyor 104. Note that, as shown in FIG. 6, reading section 97 is arranged at the front side of printing apparatus 10. Thus, even if a squeegee conveyance jig 110 is moved from the accommodation apparatus 100 in front to the reading position of reading section 97, there is no impediment to operation of print process section 20, supply section 40, mask work section 50, board fixing section 60, and imaging section 90 during the printing processing, which is described later. Accordingly, printing control section 11 can perform reading processing in parallel with printing processing. By this, printing control section 11 is able to acquire information of squeegees 30 and squeegee conveyance jigs 110 accommodated in accommodation apparatus 100 without stopping printing processing.

Note that, with regard to operation on the accommodation apparatus 100 side during reading processing, an operation routine for during reading processing may be memorized in advance on the memory section of accommodation control section 106, and printing control section 11 may issue just a starting instruction for the operation routine. Alternatively, printing control section 11 may sequentially output an individual operation command for conveyor raising and lowering section 105 and conveyance conveyor 104 to accommodation control section 106.

Figure 7:
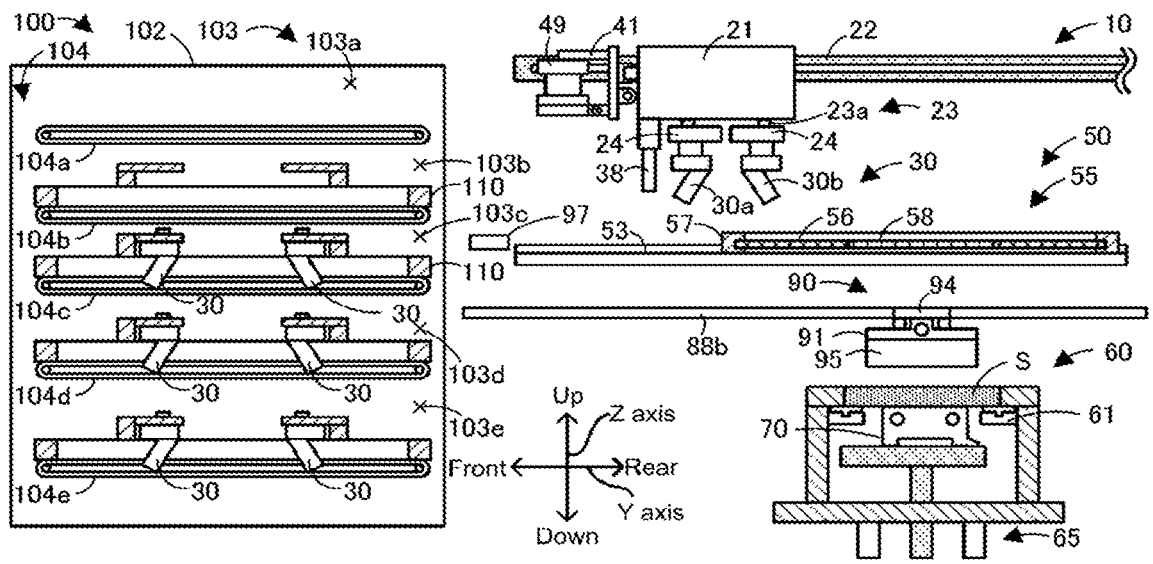
FIG. 7 illustrates a state when performing printing result acquisition processing.

Printing processing is described next. The printing processing routine of FIG. 5 is memorized on the HDD of printing control section 11, and is performed by printing control section 11 after instructions to perform printing processing are entered by an operator via display operation section 98, or is performed by printing control section 11 after instructions to perform printing processing are issued by management PC 150. When the printing processing routine is started, printing control section 11, first, performs the printing processing of steps S100 to S130. In the printing processing routine, as shown in FIG. 6, printing control section 11 performs board conveyance and fixing processing to fix board S and raise using board fixing section 60 such that board S contacts screen mask 55 (step S100). Here, printing control section 11 adjusts the position of screen mask 55 as necessary using mask work section 50 and aligns the positions of hole pattern 58 and board S. Upon board conveyance and fixing processing being performed, printing control section 11 performs solder supply processing (step S110). Specifically, printing control section 11 moves supply head 41 above screen mask 55, and emits solder from cartridge 49 onto screen mask 55. Upon solder supply processing being performed, printing control section 11 performs squeegee moving processing (step S120). Specifically, printing control section 11 moves printing head 21, lowers squeegee 30 (first squeegee 30*a* in FIG. 6) such that squeegee 30 contacts the upper surface of screen mask 55 and moves squeegee 30 in the front-rear direction such that solder is printed onto the board S. Printing control section 11 performs at least one of processing to move first squeegee 30*a* in the rear direction on screen mask 55, and processing to move second squeegee 30*b* in the front direction. Here, printing control section 11 acquires and memorizes on the HDD the load detected on squeegee by load sensor 39. Note that, printing control section 11 also memorizes information as to which of the first and second squeegees 30*a* and 30*b* the value of the acquired load applies. Upon squeegee moving processing being performed, printing control section 11 performs printing result acquisition processing of imaging board S from above using imaging section 90 and acquiring the captured image as a print result (step S130), then ends printing processing. FIG. 7 illustrates a state when performing printing result acquisition processing. As shown in FIG. 7, printing control section 11 uses support table raising and lowering section 65 to lower board S, moves imaging section 90 above board S, uses imaging section main body 95 to image the upper surface of board S, and acquires the captured image. In the present embodiment, the acquired captured image is an image that can be used for three-dimensional measurement of the solder printed onto board S using well-known three-dimensional calculating techniques. For example, imaging section 90 may illuminate board S with a specified lighting pattern from above at an angle using the lighting section of imaging section main body 95.

Upon printing processing being performed, printing control section 11 determines an exchange timing at which exchange of squeegee 30 is required due to wear of the squeegee 30 (step S140). Printing control section 11 performs the determination based on the load of squeegee 30 acquired from load sensor 39 during the squeegee moving processing of step S120. For example, in a case in which the acquired load of squeegee 30 is smaller than a specified threshold, it is determined that squeegee 30 is worn and that it is time to exchange the squeegee 30. Note that, printing control section 11 also determines for which of the first and second squeegees 30*a* and 30*b* the exchange timing applies based on information memorized during squeegee moving processing.

Upon determining the exchange timing in step S140, printing control section 11 performs squeegee exchange processing of automatically exchanging the squeegee 30 for which it was determined that it is time to exchange the squeegee 30 (step S150). In step S150, the squeegee 30 currently in use is exchanged with a squeegee of the same type, which here means a squeegee 30 with the same attack angle. Note that, printing control section 11 performs the squeegee exchange processing while referencing as appropriate the information acquired during the reading processing described above.

During squeegee exchange processing of step S150, printing control section 11 performs processing in the following order: mask unloading processing of unloading the screen mask 55 currently in use; squeegee unloading processing of unloading the squeegee 30 currently in use; squeegee loading processing of loading the exchange-use squeegee 30; and mask loading processing of loading the unloaded screen mask 55. Note that, in the present embodiment, squeegee conveyance jig 110 is conveyed using conveyance rails 53. Thus, when squeegee exchange processing is performed, first, mask unloading processing is performed such that screen mask 55 is retracted on conveyance rails 53, then, after completing squeegee exchange, mask loading processing is performed to return the screen mask 55 to its original position. Descriptions are given below of squeegee exchange processing using an example in which both first and second squeegees 30*a* and 30*b* are exchanged.

Figure 8:
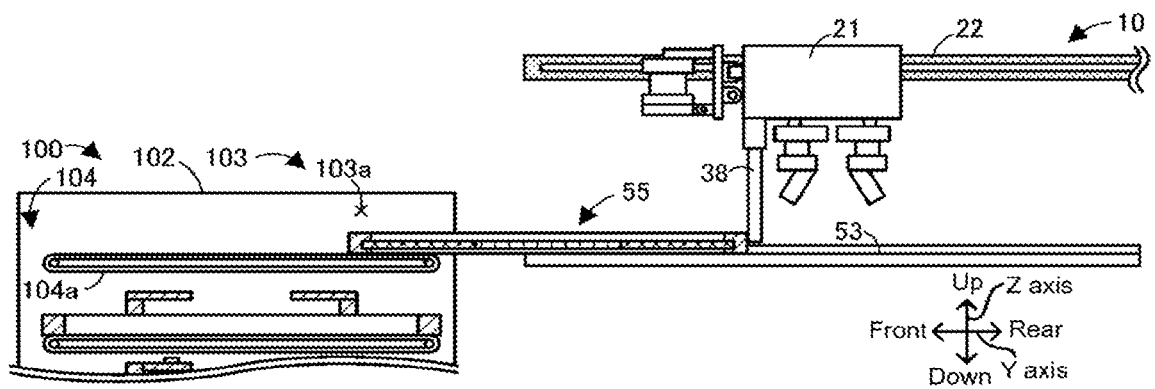
FIG. 8 illustrates a mask unloading process.

FIG. 8 illustrates a mask unloading process. When mask unloading processing is started, printing control section 11, first, operates conveyor raising and lowering section 105 such that empty conveyance conveyor 104 (here, first conveyance conveyor 104*a*) is positioned at the height for unloading screen mask 55 (unloading height). The screen mask 55 unloading height is a position at which first conveyance conveyor 104*a* and conveyance rails 53 are at the same height. Next, printing control section 11 makes conveyance rod 38 protrude down and controls printing moving section 22 such that screen mask 55 is moved forwards along conveyance rails 53 (FIG. 8). Further, printing control section 11 uses conveyance rod 38 to convey screen mask 55 to first conveyance conveyor 104*a* to unload screen mask 55. Also, printing control section 11 uses first conveyance conveyor 104*a* to further move screen mask 55 forwards, so as to accommodate screen mask 55 in accommodation section 102. Thus, screen mask 55 is vacated from conveyance rails 53 such that squeegee conveyance jig 110 can easily be conveyed on conveyance rails 53. Note that, in FIG. 8, conveyance rod 38 performs conveyance by pushing an end (here, the rear end) of screen mask 55 from the outside, but the configuration is not limited to this, for example, screen mask 55 may be conveyed by pushing the inside of frame 57. Similarly, for conveyance of squeegee conveyance jig 110 described later, conveyance rod 38 may push an end of the squeegee conveyance jig 110 from the outside, or may push the inside of frame 111, or may push squeegee 30 attached to the squeegee conveyance jig 110.

Figure 9:
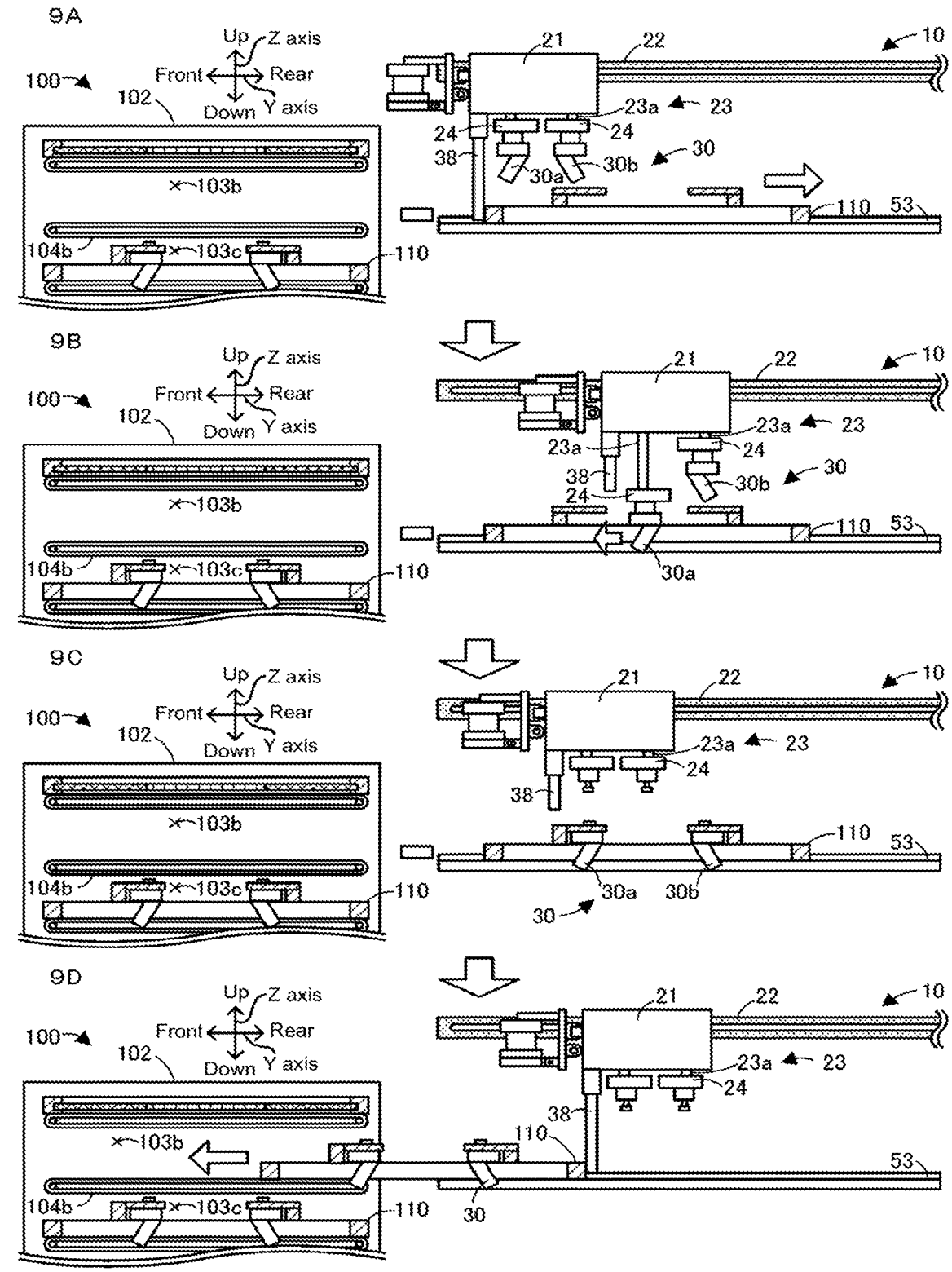
FIG. 9 illustrates a squeegee unloading process.

FIG. 9 illustrates a squeegee unloading process. During squeegee unloading processing, printing control section 11, first, operates conveyor raising and lowering section 105 such that conveyance conveyor 104 on which is loaded squeegee conveyance jig 110 with an empty holder 112 (here, second conveyance conveyor 104*b*) is positioned at the same height as conveyance rails 53 (unloading height). Further, printing control section 11 controls second conveyance conveyor 104b and conveyance rod 38 such that squeegee conveyance jig 110 is loaded inside printing apparatus 10 (FIG. 9A). Next, printing control section 11 controls printing moving section 22 and squeegee raising and lowering section 23 such that first squeegee 30a attached to squeegee fixing section 24 moves forwards, and attaches first squeegee 30a to empty holder 112 at the front side of squeegee conveyance jig 110 (FIG. 9B). Similarly, printing control section 11 moves second squeegee 30b to the rear and attaches second squeegee 30b to empty holder 112 at the rear of squeegee conveyance jig 110 (FIG. 9C). Further, printing control section 11 uses conveyance rod 38 to move the squeegee conveyance jig 110 to which squeegee 30 is attached to second conveyance conveyor 104b, and unloads the squeegee conveyance jig 110 (FIG. 9D). Also, printing control section 11 uses second conveyance conveyor 104b to further move squeegee conveyance jig 110 forwards, so as to accommodate squeegee conveyance jig 110 in accommodation section 102.

During squeegee loading processing, printing control section 11 loads squeegee 30 using a reverse procedure to the squeegee unloading processing described above. In other words, printing control section 11, first, operates conveyor raising and lowering section 105 such that third conveyance conveyor 104c on which the squeegee conveyance jig 110 to which an exchange-use squeegee 30 is attached is at the same height as conveyance rails 53 (loading height). Next, printing control section 11 uses third conveyance conveyor 104c and conveyance rod 38 to load squeegee conveyance jig 110. Continuing, printing control section 11 controls printing moving section 22 and squeegee raising and lowering section 23 such that the front side squeegee fixing section 24 is moved forwards, and the squeegee 30 attached to the front side holder 112 of squeegee conveyance jig 110 is attached to the front side squeegee fixing section 24. Similarly, printing control section 11 moves rear side squeegee fixing section 24 to the rear and attaches the squeegee 30 attached to the rear side holder 112 of squeegee conveyance jig 110 to the rear side squeegee fixing section 24. Then, printing control section 11 uses conveyance rod 38 to convey the squeegee conveyance jig 110 to which squeegee 30 is attached and uses third conveyance conveyor 104c to accommodate squeegee conveyance jig 110 in accommodation section 102.

Figure 10:
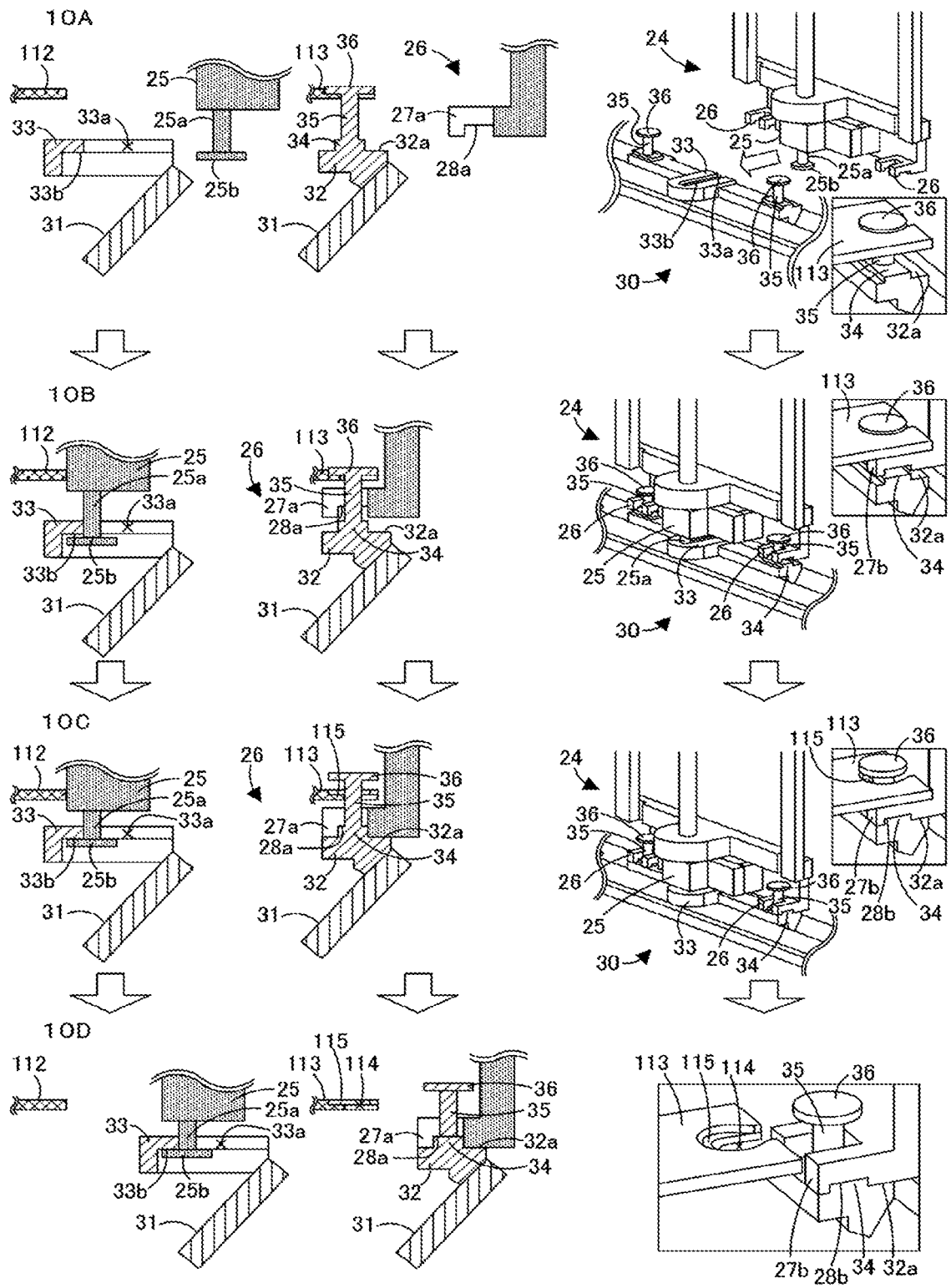
FIG. 10 illustrates operation of mounting squeegee 30 on squeegee holding section 24.

Details of transfer of squeegee 30 to holder 112 from squeegee fixing section 24, and removal of exchange-use squeegee 30 from holder 112 to squeegee fixing section 24 are described below. Details of removal of squeegee 30 are described first. FIG. 10 illustrates operation of mounting squeegee 30 on squeegee fixing section 24. Note that, FIG. 10 shows a state of the front side squeegee fixing section 24 receiving squeegee 30. Also, the left side of FIG. 10 is a schematic cross section of positioning member 33 and air cylinder 25 along the vertical front-rear direction; the center of FIG. 10 is a schematic cross section of regulating member 26 and shaft member 35 along the vertical front-rear direction; the right side of FIG. 10 is a perspective view from the front top right of squeegee fixing section 24 and squeegee 30. When receiving squeegee 30, printing control section 11, first, lowers squeegee fixing section 24 to release squeegee fixing section 24, and moves squeegee fixing section 24 forwards from the rear of the squeegee 30 that is to be received (FIG. 10A). Thus, cylinder shaft 25a is inserted into opening section 33a of squeegee 30. Here, shaft member 35 of squeegee 30 is inserted between claw sections 27a and 27b of regulating member 26. Further, cylinder shaft 25a contacts positioning member 33 and the forward movement of cylinder shaft 25a is regulated by positioning member 33, such that the position of both in the front-rear direction is determined (FIG. 10B). This position is the squeegee 30 receiving position. Note that, in the present embodiment, the receiving position is the position at which the rear surface of positioning member 33 at the opening section 33a (the stopping position of opening section 33a) and the front surface of cylinder shaft 25a contact each other. However, the receiving position may be the position at which flange 25b and positioning member 33 contact such that movement to the front of flange 25b is regulated by positioning member 33. Also, when squeegee fixing section 24 is positioned at the receiving position, recess 28a of regulating member 26 is positioned directly above protruding section 34 of squeegee 30 (FIG. 10B). Continuing, printing control section 11 controls air cylinder 25 such that squeegee fixing section 24 is switched to the fixed state from the released state (FIG. 10C). By this, flange 25b is raised to the position of the fixed state, and pushes up held surface 33b of positioning member 33. Thus, flange section 36 is pushed up, the engaging of flange section 36 and engaging section 115 of holder 112 is released, and squeegee 30 is moved to the removal position. Also, by this, protruding sections 34 of squeegee 30 are raised up, inserted into recesses 28a and 28b of squeegee fixing section 24, and engaged with regulating member 26. By the engagement of regulating member 26 and protruding section 34, the movement of squeegee 30 in the front-rear direction with respect to squeegee fixing section 24 is regulated. Also, in the fixed state, held surface 33b that is the lower surface of positioning member 33 and held surface 32a that is the upper surface of attachment member 32 are configured such that squeegee 30 is fixedly held in squeegee fixing section 24 by being sandwiched between the upper surface of cylinder shaft 25a of squeegee fixing section 24 and the lower surface of regulating member 26. Also, printing control section 11 controls printing moving section 22 to move squeegee fixing section 24 to the rear. By this, flange 36 of squeegee 30 passes through opening section 114 and squeegee 30 is completely removed from holder 112 (FIG. 10D). Note that, when exchange-use second squeegee 30b is received by squeegee fixing section 24 from the rear side holder 112 of squeegee conveyance jig 110, printing control section 11 may perform the above operation and corresponding reverse operations.

Transfer of squeegee 30 from squeegee fixing section 24 to holder 112 may be performed using a procedure the reverse of the above receiving. When transferring first squeegee 30 to the front side holder 112 of squeegee conveyance jig 110, printing control section 11, first, lowers the front side squeegee fixing section 24, and moves the squeegee fixing section 24 forwards from the rear of holder 112. By this, flange 36 is positioned directly above engaging sections 115 of empty holder 112. This position is the squeegee 30 transfer position. Next, printing control section 11 switches the squeegee fixing section 24 from the fixed state to the released state. By this, engaging sections 115 and flange section 36 engage, squeegee 30 is positioned at the attachment position, and squeegee 30 is attached to holder 112. Also, the engaging of regulating member 26 and protruding sections 34 is released. Further, printing control section 11 moves squeegee fixing section 24 to the rear. Note that, when second squeegee 30b is transferred to the rear side holder 112 of squeegee conveyance jig 110, printing control section 11 may perform the above operation and corresponding reverse operations.

Described next is mask loading processing. Printing control section 11 is able to perform mask loading processing using a reverse procedure to the above mask unloading processing. During mask loading processing, printing control section 11, first, operates conveyor raising and lowering section 105 such that conveyance conveyor 104 (here, first conveyance conveyor 104a) is positioned at the height for loading screen mask 55 unloaded during mask unloading processing (loading height). The screen mask 55 loading height is the same as the screen mask 55 unloading height. Next, printing control section 11 uses first conveyance conveyor 104a and conveyance rod 38 to convey the screen mask 55 to the rear so as to load the screen mask 55. When the above mask unloading processing, squeegee unloading processing, squeegee loading processing, and mask loading processing have been performed, printing control section 11 ends the squeegee exchange processing of step S150.

After step S150, or if it is not exchange timing for squeegee 30 in step S140, printing control section 11 determines whether the attack angle of the squeegee 30 currently in use is appropriate (step S160). Specifically, printing control section 11, first, performs three-dimensional measurement based on the captured image acquired in printing result acquisition processing of step S130 to measure the state of the volume of solder printed on board S. For example, a phase shift method may be used for the three-dimensional measurement. Further, printing control section 11 may judge whether a printing result is acceptable by comparing the measured three-dimensional solder to a three-dimensional pattern of solder known to be good memorized on the HDD in advance, and determine that the attack angle is inappropriate if the printing result is not acceptable. Note that, not just whether the attack angle is acceptable may be determined, but also whether the attack angle is too large or too small may be determined. For example, if the solder level is low for the upstream side of the squeegee movement direction but a shape with a specified protruding pattern for the downstream side, it may be determined that the printing result is defective due to the attack angle being too large. Note that, printing control section 11, in a case in which it is determined that the attack angle is inappropriate, sets the one or greater squeegee used in the immediately prior squeegee moving processing from among the first and second squeegees 30a and 30b as the exchange target.

Upon determining that the attack angle is inappropriate in S160, printing control section 11 performs squeegee exchange processing of automatically exchanging the squeegee 30 that was set as the exchange target (S170). In step S170, squeegee exchange processing is the same as in step S150 except for that exchange is performed of the squeegee currently in use for a squeegee 30 with a different attack angle. Note that, printing control section 11 may determine which squeegee 30 accommodated in accommodation device 100 to exchange based on information acquired in reading processing and the determination as to whether the attack angle of the exchange target squeegee 30 was too large or too small. For example, printing control section 11, upon determining that the attack angle was larger than the appropriate attack angle, based on the information acquired in reading processing, may identify a squeegee 30 with a smaller attack angle than that of the squeegee 30 currently in use accommodated in accommodation region 103, and automatically exchange that squeegee 30 with the squeegee 30 currently in use.

After S170, or in a case in which it is determined that the attack angle of squeegee 30 is appropriate in S160, printing control section 11 determines whether production is complete (S180), and if production is not complete, performs processing from S100 again. In other words, printing control section 11 repeats printing processing while exchanging squeegee 30 as necessary. If production is complete in S180, printing control section 11 ends the printing processing routine.

Here, correspondences between constituent elements of printing apparatus 10 of the present embodiment and constituent elements of a printing apparatus of the disclosure are described next. Squeegee fixing section 24 of the present embodiment corresponds to a "squeegee fixing section" of the printing apparatus of the disclosure; printing moving section 22 and squeegee raising and lowering section 23 correspond to a "squeegee moving section". Further, positioning member 33 corresponds to a "positioning member"; regulating member 26 corresponds to a regulating member; flange 25b corresponds to a "first sandwiching member"; regulating member 26 corresponds to a "second sandwiching member"; printing moving section 22, conveyance rod 38, and conveyance rail 53 correspond to a "conveyance section"; printing control section 11 corresponds to an "exchange control section"; and load sensor 39 and printing control section 11 correspond to a "detection section".

Printing apparatus 10 of the present embodiment described above performs printing by moving squeegee 30 by a squeegee moving section (here, printing moving section 22 and squeegee raising and lowering section 23) moving squeegee fixing section 24 that is in a fixed state. Then, when exchanging squeegee 30, squeegee fixing section 24 is switched from a fixed state to a released state. Thus, for example, when exchanging a squeegee 30, there is no need for an operator to perform work of removing screws in order to remove the squeegee 30. Accordingly, printing apparatus 10 is able to reduce the work of an operator related to squeegee 30 exchange.

Also, for printing apparatus 10, printing moving section 22 and squeegee raising and lowering section 23 are configured to move squeegee fixing section 24 to a receiving position for receiving exchange-use squeegee 30, and the squeegee 30 includes positioning member 33 configured to perform positioning of squeegee fixing section 24 and squeegee 30 by contacting cylinder shaft 25a of squeegee fixing section 24 that has been moved to the receiving position. By this, when squeegee fixing section 24 is moved towards the receiving position, the position is decided at the receiving position by squeegee fixing section 24 and positioning member 33 of exchange-use squeegee 30 contacting each other. Accordingly, with printing apparatus 10, the position deviation of both squeegee fixing section 24 and squeegee 30 is curtailed during fixing.

Further, with printing apparatus 10, squeegee fixing section 24 includes regulating member 26 that regulates front-rear movement of squeegee 30 with respect to squeegee fixing section 24 by engaging with protruding section 34 of squeegee 30 in a fixed state. Accordingly, printing apparatus 10 is able to curtail the position deviation of squeegee fixing section 24 and squeegee 30 in a fixed state using regulating member 26. Also, regulating member 26 engages with protruding section 34 of squeegee 30 in a state with positioning performed by positioning member 33. Therefore, the position deviation between regulating member 26 and protruding section 34 of squeegee 30 is curtailed, and both engage with each other reliably.

Further, squeegee fixing section 24 includes flange 25*b* and regulating member 26 configured to sandwich squeegee 30 in a fixed state and to move relatively away from each other in a vertical direction in a released state compared to the fixed state. Accordingly, printing apparatus 10 is able to switch between a state with flange 25*b* and regulating member 26 close to each other and a state with flange 25*b* and regulating member 26 separate from each other in a vertical direction with a relatively simple configuration, thereby enabling switching between the fixed state and the released state with a relatively simple configuration.

Also, printing moving section 22 and squeegee raising and lowering section 23 are configured to move squeegee fixing section 30 to a squeegee 30 receiving position from holder 112 of squeegee conveyance jig 110 to which exchange-use squeegee 30 is attached. Also, flange 25*b*, when squeegee fixing section 24 moves at the receiving position to the position in the fixed state (here, being raised) from the position in the released state, in accordance with this movement, moves the exchange-use squeegee 30 to a removal position at which removal from holder 112 is possible. Thus, squeegee fixing section 24, by the switching from the released state to the fixed state, not only fixes squeegee 30 but also performs movement to the removal position of squeegee 30. Accordingly, for example, compared to a case in which printing apparatus 10 performs movement to the squeegee 30 removal position and fixing of squeegee 30 separately, squeegee 30 exchange can be performed efficiently.

Further, printing apparatus 10 is provided with printing moving section 22, conveyance rod 38, and conveyance rails 53 as a conveyance section for conveying squeegee conveyance jig 110 to which exchange-use squeegee 30 is attached, and printing control section 11 that performs squeegee exchange processing. Also, printing control section 11, during squeegee exchange processing, performs squeegee unloading processing by controlling printing moving section 22, squeegee raising and lowering section 23, conveyance rod 38, and conveyance rails 53 to move squeegee conveyance jig 110 to a transfer position at which squeegee 30 fixed by squeegee fixing section 24 is transferred to squeegee conveyance jig 110, switch squeegee fixing section 24 to a released state, attach squeegee 30 to squeegee conveyance jig 110, and unload the squeegee conveyance jig 110 to which the squeegee 30 was attached. Also, printing control section 11, during squeegee exchange processing, performs squeegee loading processing by controlling printing moving section 22, squeegee raising and lowering section 23, conveyance rod 38, and conveyance rails 53 to load squeegee conveyance jig 110 to which exchange-use squeegee 30 is attached, to move the squeegee fixing section 24 to a receiving position at which squeegee 30 is received from squeegee conveyance jig 110, remove squeegee 30 from squeegee conveyance jig 110, switch squeegee fixing section 24 to the fixed state to fix the squeegee 30 in squeegee fixing section 24, and unload the squeegee conveyance jig 110 from which the squeegee 30 was removed. Accordingly, printing apparatus 10 is able to perform automatic exchange of squeegee 30, thereby reducing the work of an operator related to squeegee 30 exchange.

Further, the above-described conveyance section (here, printing moving section 22, conveyance rod 38, and conveyance rails 53) and squeegee moving section (here, printing moving section 22 and squeegee raising and lowering section 23) have a configuration in which at least a portion is shared (printing moving section 22). Accordingly, compared to a case in which printing apparatus 10 is configured with a completely separate conveyance section and squeegee moving section, the quantity of components of printing apparatus 10 can be reduced.

Further, printing apparatus 10 is provided with load sensor 39 and printing control section 11 for detecting an exchange timing at which exchange of squeegee 30 is taken to be required due to wear of squeegee 30. Also, printing control section 11 performs squeegee exchange processing when exchange timing is detected. Accordingly, printing apparatus 10 can automatically exchange squeegee 30 when exchange is required due to wear to squeegee 30.

Further, the conveyance section (here, printing moving section 22, conveyance rod 38, and conveyance rails 53) is configured to load and unload squeegee conveyance jig 110 to which at least one squeegee 30 is attached to and from accommodation apparatus 100 that accommodates at least one type of squeegee 30 with an attack angle different to that of the squeegee 30 fixed by the squeegee fixing section 24. Also, printing control section 11 receives printing result information related to a printing result of printing processing from imaging section 90, and upon determining that the attack angle of the squeegee 30 fixed by the squeegee fixing section 24 is inappropriate, performs squeegee exchange processing to exchange the squeegee 30 with a squeegee 30 with a different attack angle. Accordingly, printing apparatus 10 is able to automatically exchange a squeegee 30 with an inappropriate attack angle.

Meanwhile, it goes without saying that the disclosure is not limited to the above-mentioned embodiment and various embodiments may be applied within the technical scope of the disclosure.

For example, in an embodiment above, squeegee fixing section 24, in the fixed state, sandwiches attachment member 32 of squeegee 30 between the upper surface of flange 25*b* and the lower surface of regulating member 26, but the configuration is not limited to this. For example, attachment member 32 may be sandwiched between the upper surface of flange 25*b* and the lower surface of the main body of air cylinder 25 that is directly above flange 25*b*. Also, in an embodiment above, squeegee fixing section 24 sandwiches squeegee 30 from above and below, but the configuration is not limited to this, and sandwiching may be performed in a front-rear direction. Further, squeegee fixing section 24 may fix squeegee 30 using a method other than sandwiching.

In an embodiment above, printing control section 11 detects the exchange timing of squeegee 30 based on the load detected by load sensor 39 provided on print process section 20, but the configuration is not limited to this. For example, printing control section 11 may detect the exchange timing based on the load detected by a load sensor provided on board fixing section 60.

Alternatively, printing control section 11 may determine whether it is time to exchange squeegee due to wear of squeegee 30 based on printing result information of board S acquired in S130. Also, the exchange timing may be timing of when exchange is assumed to be required due to wear to squeegee 30, and it may not be necessary to determine whether squeegee 30 is actually worn. For example, printing control section 11, may determine that squeegee 30 is worn and requires exchange because the operation time of printing apparatus 10 from when squeegee 30 was attached to squeegee fixing section 24 exceeds a specified threshold value. Alternatively, printing control section 11 may exchange squeegee 30 when the quantity of times printing processing has been performed exceeds a specified threshold value.

In an embodiment above, printing control section 11 receives printing result information acquired by imaging section 90 provided on printing apparatus 10, but the configuration is not limited to this. For example, printing control section 11 may receive printing result information from a separate printing result acquiring device positioned downstream in the flow direction of board S by printing apparatus 10 in printing system 1. Alternatively, printing control section 11 may receive printing result information from management PC 150. Also, in an embodiment described above, printing result information is a captured image, and printing control section 11 determines whether the attack angle is inappropriate based on the received printing result information, but the configuration is not limited to this. For example, a printing result acquiring device (for example, inspection device) of a downstream printing apparatus 10 or an imaging section 90 may determine whether the attack angle is appropriate. In this case, printing control section 11 may receive information of whether the attack angle is inappropriate as printing result information.

In an embodiment above, as timing to exchange squeegee 30, examples of exchange being required due to wear to squeegee 30 and of exchange being required due to a squeegee 30 with an inappropriate attack angle based on printing results are given, but the configuration is not limited to this. For example, printing control section 11 may perform squeegee exchange processing when changeover is performed when changing to a different type of board S as the print target.

In an embodiment above, printing control section 11 performs reading processing during printing, but the configuration is not limited to this. For example, printing control section 11 may first perform reading processing when performing at least one of squeegee exchange processing of S150 and S170 of FIG. 5. Alternatively, printing control section 11, instead of performing reading processing, may receive information related to squeegee 30 and squeegee conveyance jig 110 accommodated in accommodation section 102 from management PC 150, or from an operator via inputs into display operation section 98. Also, it may be decided as a rule to accommodate an empty squeegee conveyance jig 110 in one of the accommodation regions 103 in advance, or to accommodate any of the types of exchange-use squeegees 30 in any of the accommodation regions 103 in advance. In this case, printing control section 11 may memorize that rule in advance, and printing control section 11 does not have to perform reading processing if an operator accommodates the squeegee 30 and squeegee conveyance jig 110 in the accommodation region 103 in accordance with the rule.

In an embodiment above, printing apparatus 10 is provided with reading section 97, but the configuration is not limited to this, for example, accommodation apparatus 100 may be provided with reading section 97. In this case, instead of printing control section 11, accommodation control section 106 may perform the above reading processing, and output the acquired information to printing control section 11. In this case too, it is possible for accommodation control section 106 to perform reading processing without stopping printing processing by printing control section 11.

In an embodiment above, barcode 116 is affixed to squeegee conveyance jig 110, but the configuration is not limited to this, and a barcode may be affixed to squeegee 30. Also, in an embodiment above, barcode 116 is affixed to squeegee conveyance jig 110, but the configuration is not limited to this, and a code other than a barcode such as another type of 2D code may be affixed.

In an embodiment above, printing control section 11 performs mask unloading processing before performing squeegee unloading processing during squeegee exchange processing, but the configuration is not limited to this. For example, in a case in which it is possible to perform transfer of squeegee 30 with squeegee conveyance jig 110 and squeegee fixing section 24 in a region in front of screen mask 55 without retracting screen mask 55, printing control section 11 does not have to perform mask unloading processing before squeegee unloading processing.

Descriptions were not given for an embodiment above, but when starting squeegee exchange processing of S150 and S170, printing control section 11 may determine whether the required squeegee 30 is accommodated in accommodation apparatus 100 based on information read during reading processing. Further, printing control section 11 may, upon determining that a required exchange-use squeegee 30 is not accommodated, output error information indicating that fact to at least one of display operation section 98 or management PC 150, so as to report to an operator that a squeegee 30 is missing.

In an embodiment described above, accommodation apparatus 100 is provided with accommodation control section 106, and printing control section 11 controls accommodation apparatus 100 indirectly by outputting commands to accommodation control section 106, but the configuration is not limited to this and accommodation control section 106 may be omitted. In this case, for example, printing control section 11 may directly control conveyance conveyor 104 and conveyor raising and lowering section 105 via communication.

In an embodiment above, accommodation apparatus 100 is provided with a moving section and can be moved by an operator, but the configuration is not limited to this and a moving section does not have to be provided. Also, accommodation apparatus 100 may be configured from an AGV (Automatic Guided Vehicle) that can travel autonomously and is provided with a drive mechanism for driving a moving section. In this case, accommodation apparatus 100 may move to a location at which exchange-use squeegee 30 and squeegee conveyance jig 110 are stored and may automatically accommodate exchange-use squeegee 30 and squeegee conveyance jig 110 in accommodation section 102.

With an embodiment above, printing apparatus 10 may be provided with a state detection section that detects at least one of whether squeegee fixing section 24 is in a fixed state or whether squeegee fixing section 24 is in a released state. In this case, printing control section 11, for example, when controlling squeegee fixing section 24 to switch to the fixed state, may detect whether squeegee fixing section 24 has correctly switched to the fixed state based on a detection result of the state detection section. Accordingly, printing control section 11, for example, is able to detect a receiving error of squeegee 30 from holder 112. Similarly, printing control section 11, by detecting whether squeegee fixing section 24 has correctly switched to the released state, is able to check whether there has been a transfer error of squeegee 30 to holder 112. The state detection section, for example, may be an autoswitch that detects a position of cylinder shaft 25a of air cylinder 25 of squeegee fixing section 24.

With an embodiment above, printing control section 11 performs automatic exchange of squeegee 30, but the configuration is not limited to this, an operator may perform exchange of squeegee 30. In this case too, because attachment and removal of squeegee 30 is performed by squeegee fixing section 24 switching to and from a fixed state and a released state, for example, there is no need for an operator to perform manual work of attaching and removing screws that attach the squeegee. As a result, operator work is reduced. Note that, when an operator performs exchange of squeegee 30, printing apparatus 10 may be provided with an operation section for an operator to issue instructions to squeegee fixing section 24 to switch to and from the fixed state and the released state. The operation section may be, for example, a button of display operation section 98, or a button arranged on squeegee fixing section 24.

In an embodiment above, each squeegee 30 is an open squeegee, but the configuration is not limited to this and squeegees may be sealed squeegees. Also, squeegee fixing section 24 may be configured to allow open squeegees and sealed squeegees to be attached. Also, squeegee fixing section may be configured to allow the selective mounting of a head including a function other than that of a squeegee. Examples of this kind of head include a dispensing head for dispensing a viscous fluid onto board S, or an inspection head for performing inspection by imaging board S.

A printing apparatus of the present disclosure may be configured as follows.

A printing apparatus of the present disclosure may be configured such that the squeegee moving section is configured to move the squeegee fixing section to a receiving positioning for receiving an exchange-use squeegee, and the squeegee includes a positioning member configured to perform positioning of the squeegee fixing section and the squeegee by contacting the squeegee fixing section that has been moved to the receiving position. By this, when the squeegee fixing section is moved towards the receiving position, the position is decided at the receiving position by the squeegee fixing section and the positioning member of the exchange-use squeegee contacting each other. Accordingly, with the printing apparatus, the position deviation of both the squeegee fixing section and the squeegee is curtailed during fixing.

A printing apparatus of the present disclosure may be configured such that the squeegee fixing section includes a regulating member configured to engage with the squeegee in the fixed state so as to regulate movement of the squeegee with respect to the squeegee fixing section in at least one direction. Accordingly, the printing apparatus is able to curtail the position deviation of the squeegee fixing section and the squeegee in a fixed state using the regulating member. Note that, in this case, when the squeegee includes the above positioning member, the regulating member engages with the squeegee in a state with positioning performed by the positioning member. Therefore, the position deviation between the regulating member 26 and the engaged section of the squeegee is curtailed, and both engage with each other reliably.

A printing apparatus of the present disclosure may be configured such that the squeegee fixing section includes a first sandwiching member and a second sandwiching member configured to sandwich the squeegee in the fixed state and to move relatively away from each other in the released state compared to the fixed state. Accordingly, the printing apparatus 10 is able to switch between a state with the first sandwiching member and the second sandwiching member close to each other and a state with the first sandwiching member and the second sandwiching member separate from each other with a relatively simple configuration, thereby enabling switching between the fixed state and the released state with a relatively simple configuration.

In this case, the squeegee moving section may be configured to move the squeegee fixing section from a holder to which the exchange-use squeegee is attached to the squeegee receiving position, and the configuration may be such that, when the squeegee fixing section is moved at the receiving position from the position in the released state to the position in the fixed state, in accordance with this movement, the first sandwiching member moves the exchange-use squeegee to a removal position at which the squeegee can be removed from the holder. Thus, the squeegee fixing section, by the switching from the released state to the fixed state, not only fixes the squeegee but also performs movement to the removal position of the squeegee. Accordingly, for example, compared to a case in which the printing apparatus performs movement to the squeegee removal position and fixing of the squeegee separately, the squeegee exchange can be performed efficiently.

In this case, the squeegee may include a shaft member and a flange section formed on the shaft member, the holder may include a support section including an opening through which the shaft member can pass, and an engaging section configured to engage with the flange section formed on the support section so as to fix the squeegee, and the configuration may be such that, when the squeegee fixing section is moved at the receiving position from the position in the released state to the position in the fixed state, the first sandwiching member in accordance with this movement, by pushing up the exchange-use squeegee, releases the engaging of the flange section and the engaging section, moves the squeegee to the removal position, and sandwiches the squeegee between the first sandwiching member and the second sandwiching member.

A printing apparatus of the present disclosure may be further provided with a conveyance section configured to convey a conveyance jig to which the exchange-use squeegee is attached, and an exchange control section configured to perform squeegee exchange processing, wherein the exchange control section is configured to perform, during the squeegee exchange processing, squeegee unloading processing of controlling the squeegee moving section and the conveyance section to load the conveyance jig, move the squeegee fixed to the squeegee fixing section to a transfer position for transfer to the conveyance jig, switch the squeegee fixing section to the released state, attach the squeegee to the conveyance jig, and unload the conveyance jig to which the squeegee is attached, and squeegee loading processing of controlling the squeegee moving section and the conveyance section to load the conveyance jig attached to which is the exchange-use squeegee, move the squeegee fixing section to the removal position for removing the squeegee from the conveyance jig, remove the squeegee from the conveyance jig, switch the squeegee fixing section to the fixed state, fix the squeegee to the squeegee fixing section, and unload the conveyance jig from which the squeegee was removed. Accordingly, the printing apparatus is able to perform automatic exchange of the squeegee, thereby reducing the work of an operator related to squeegee exchange.

In this case, the conveyance section and the squeegee moving section may be a mechanism that shares at least a portion. Accordingly, compared to a case in which the printing apparatus is configured with a completely separate conveyance section and squeegee moving section, the quantity of components of the printing apparatus can be reduced.

For a printing apparatus of the present disclosure in which the printing control section performs squeegee exchange processing, the printing apparatus may further include a detection section configured to detect an exchange timing at which exchange of the squeegee is considered necessary due to wear of the squeegee, and the exchange control section may be configured to perform squeegee exchange processing when the detection section has detected the exchange timing. Accordingly, the printing apparatus can automatically exchange the squeegee when exchange is required due to wear to the squeegee.

For a printing apparatus of the present disclosure in which the printing control section performs squeegee exchange processing, the conveyance section may be configured to perform loading and unloading of the conveyance jig to which at least one of the squeegees accommodated in an accommodation apparatus is attached to and from the accommodation apparatus that accommodates at least one type of the squeegee having a different attack angle to the squeegee fixed to the squeegee fixing section, and the exchange control section may be configured to receive printing result information relating to a printing result of the printing, and in a case in which it is determined based on the printing result information that the attack angle of the squeegee fixed to the squeegee fixing section is inappropriate, perform the squeegee exchange processing to exchange the squeegee for a squeegee with a different attack angle. Accordingly, the printing apparatus is able to automatically exchange a squeegee with an inappropriate attack angle.

INDUSTRIAL APPLICABILITY

The present disclosure may be applied to a printing apparatus that prints a viscous fluid onto a print target such as a board.

REFERENCE SIGNS LIST

1: printing system;
10: printing apparatus;
11: printing control section;
20: print process section;
21: printing head;
22: printing moving section;
23: squeegee raising and lowering section;
23a: piston rod;
24: squeegee fixing section;
25: air cylinder;
25a: cylinder shaft;
25b: flange;
26: regulating member;
27a, 27b: claw section;
28a, 28b: recess;
30: squeegee;
30a, 30b: first and second squeegee;
31: squeegee blade;
32: attachment member;
32a: held surface;
33: positioning member;
33a: opening section;
33b: held surface;
34: protruding section;
35: shaft member;
36: flange section;
38: conveyance rod;
39: load sensor;
40: supply section;
41: supply head;
49: cartridge;
50: mask work section;
51: mask fixing section;
52: position adjusting section;
53: conveyance rail;
55: screen mask;
56: mask main body;
57: frame;
57a: barcode;
58: hole pattern;
60: board fixing section;
61: board conveyance conveyor;
65: board raising and lowering section;
70: board support member;
90: imaging section;
91: carriage;
92: imaging moving section;
93: X-axis slider;
94: Y-axis slider;
95: imaging section main body;
97: reading section;
98: display operation section;
100: accommodation apparatus;
101: housing;
102: accommodation section;
103: accommodation region;
103a to 103e: first to fifth accommodation regions;
104: conveyance conveyor;
104a to 104e: first to fifth conveyance conveyors;
105: conveyor raising and lowering section;
106: accommodation control section;
110: squeegee conveyance jig;
111: frame;
112: holder;
113: support section;
114: opening section;
115: engaging section;
116: barcode;
150: management PC;
S: board

The invention claimed is:

1. A printing apparatus comprising:
a squeegee fixing section configured to switch to and from a fixed state in which a squeegee used to print a viscous fluid onto a print target is fixed and a released state in which the squeegee is not fixed, the squeegee fixing section including a first shaft member and a first flange section formed on an end of the first shaft member, the first shaft member movable in a vertical direction to move the first flange section between a lowered position corresponding to the released state and a raised position to sandwich the squeegee between the first flange section and a lower surface of the squeegee fixing section corresponding to the fixed state; and
a squeegee moving section including a slider configured to move the squeegee fixed by the squeegee fixing section above a screen mask during printing by moving the squeegee fixing section.

2. The printing apparatus according to claim 1, wherein
the squeegee moving section is configured to move the squeegee fixing section to a receiving position for receiving an exchange-use squeegee, and
the squeegee includes a positioning member configured to perform positioning of the squeegee fixing section and the squeegee by contacting the squeegee fixing section that has been moved to the receiving position.

3. The printing apparatus according to claim 1, wherein
the squeegee fixing section includes a regulating member configured to engage with the squeegee in the fixed state so as to regulate movement of the squeegee with respect to the squeegee fixing section in at least one direction.

4. The printing apparatus according to claim 1, wherein the first flange section and the lower surface of the squeegee fixing section move relatively away from each other in the released state compared to the fixed state.

5. The printing apparatus according to claim 4, wherein the squeegee moving section is configured to move the squeegee fixing section from a holder to which an exchange-use squeegee is attached to a receiving position, and when the squeegee fixing section is moved at the receiving position from a position in the released state to a position in the fixed state, in accordance with this movement, the first flange section moves the exchange-use squeegee to a removal position at which the squeegee can be removed from the holder.

6. The printing apparatus according to claim 5, wherein the squeegee includes a second shaft member and a second flange section formed on the second shaft member, the holder includes
a support section including an opening through which the second shaft member can pass, and
an engaging recess configured to engage with the second flange section formed on the support section so as to fix the squeegee, and when the squeegee fixing section is moved at the receiving position from the position in the released state to the position in the fixed state, the first flange section in accordance with this movement, by pushing up the exchange-use squeegee, releases the engaging of the second flange section and the engaging recess, moves the squeegee to the removal position, and sandwiches the squeegee between the first flange section and the lower surface of the squeegee fixing section.

7. The printing apparatus according to claim 1, wherein the squeegee includes an opening through which the first shaft member can pass through in the released state and includes a held surface that is contacted by the first flange section in the fixed state.

8. The printing apparatus according to claim 1, wherein the squeegee fixing section includes an air cylinder to move the first shaft in the vertical direction.

9. A printing apparatus comprising:
a squeegee fixing section configured to switch to and from a fixed state in which a squeegee used to print a viscous fluid onto a print target is fixed and a released state in which the squeegee is not fixed;
a squeegee moving section configured to move the squeegee fixed by the squeegee fixing section above a screen mask during printing by moving the squeegee fixing section; a conveyance rail configured to convey a conveyance jig to which an exchange-use squeegee is attached; and an processing circuitry configured to perform squeegee exchange processing, including
squeegee unloading processing of controlling the squeegee moving section and the conveyance rail to load the conveyance jig, move the squeegee fixed to the squeegee fixing section to a transfer position for transfer to the conveyance jig, switch the squeegee fixing section to the released state, attach the squeegee to the conveyance jig, and unload the conveyance jig to which the squeegee is attached, and
squeegee loading processing of controlling the squeegee moving section and the conveyance rail to load the conveyance jig attached to which is the exchange-use squeegee, move the squeegee fixing section to a removal position for removing the squeegee from the conveyance jig, remove the squeegee from the conveyance jig, switch the squeegee fixing section to the fixed state, fix the squeegee to the squeegee fixing section, and unload the conveyance jig from which the squeegee was removed.

10. The printing apparatus according to claim 9, wherein the conveyance rail and the squeegee moving section are a mechanism that shares at least a portion.

11. The printing apparatus according to claim 9, further comprising
a sensor configured to detect an exchange timing at which exchange of the squeegee is considered necessary due to wear of the squeegee, and
the processing circuitry is configured to perform squeegee exchange processing when the sensor has detected the exchange timing.

12. The printing apparatus according to claim 9, wherein the conveyance rail is configured to perform loading and unloading of the conveyance jig to which at least one of multiple squeegees accommodated in an accommodation apparatus is attached to and from the accommodation apparatus that accommodates at least one type of the squeegee having a different attack angle to the squeegee fixed to the squeegee fixing section, and
the processing circuitry is configured to receive printing result information relating to a printing result of the printing, and in a case in which it is determined based on the printing result information that an attack angle of the squeegee fixed to the squeegee fixing section is inappropriate, perform the squeegee exchange processing to exchange the squeegee for a squeegee with a different attack angle.

* * * * *